(12) United States Patent
Miyaharu et al.

(10) Patent No.: US 10,761,316 B2
(45) Date of Patent: Sep. 1, 2020

(54) ILLUMINATION APPARATUS, OPTICAL APPARATUS, IMPRINT APPARATUS, PROJECTION APPARATUS, AND METHOD OF MANUFACTURING ARTICLE

(71) Applicant: CANON KABUSHIKI KAISHA, Tokyo (JP)

(72) Inventors: Takafumi Miyaharu, Utsunomiya (JP); Ken-ichiro Shinoda, Utsunomiya (JP); Takahiro Matsumoto, Utsunomiya (JP); Kazuhiro Sato, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 611 days.

(21) Appl. No.: 15/472,659

(22) Filed: Mar. 29, 2017

(65) Prior Publication Data

US 2017/0285331 A1 Oct. 5, 2017

(30) Foreign Application Priority Data

Mar. 31, 2016 (JP) .................................. 2016-073177

(51) Int. Cl.
*G02B 26/08* (2006.01)
*G02B 3/00* (2006.01)
(Continued)

(52) U.S. Cl.
CPC ....... *G02B 26/0833* (2013.01); *G02B 3/0006* (2013.01); *G02B 27/0025* (2013.01); *G03F 7/0002* (2013.01); *H04N 9/3114* (2013.01)

(58) Field of Classification Search
CPC .............. G02B 26/0833; G02B 3/0006; G02B 27/0025; G02B 5/0891; G02B 5/1814;
(Continued)

(56) References Cited

U.S. PATENT DOCUMENTS 7,613,538 B2 11/2009 Inu et al.
8,465,910 B2 6/2013 Singer et al.
(Continued)

FOREIGN PATENT DOCUMENTS

CN 102138201 A 7/2011
CN 105372932 A 3/2016
(Continued)

OTHER PUBLICATIONS

Office Action issued in Taiwanese Appln. No. 106109382 dated May 24, 2018. English Translation provided.
(Continued)

*Primary Examiner* — Stella K Yi
(74) *Attorney, Agent, or Firm* — Rossi, Kimms & McDowell LLP

(57) ABSTRACT

The present invention provides an illumination apparatus which performs oblique illumination, the apparatus including a first optical element formed with an array of a plurality of optical components each configured to generate a point light source, and a second optical element configured to receive light from the first optical element and form an illumination region, with a power thereof in one direction being different from a power thereof in a direction perpendicular to the one direction, wherein at least one of the first optical element and the second optical element has a rotation angle about an optical axis thereof so as to perform compensate for distortion of the illumination region by the oblique illumination.

13 Claims, 13 Drawing Sheets

(51) Int. Cl.
*G02B 27/00* (2006.01)
*G03F 7/00* (2006.01)
*H04N 9/31* (2006.01)

(58) Field of Classification Search
CPC ..... G02B 6/3516; G02B 7/182; G03F 7/0002;
H04N 9/3114; H04N 1/0283; H04N
1/00635; H04N 1/0635; H04N 1/113;
H04N 5/7458; H04N 13/365; H04N
2201/0246; B29C 64/277; B29C 64/295;
B29C 65/1641; B29C 65/1645; B29C
65/20; B29C 65/2015
See application file for complete search history.

(56) References Cited

U.S. PATENT DOCUMENTS

| | | |
|---|---|---|
| 9,594,301 B2 | 3/2017 | Hayashi et al. |
| 9,904,060 B2 | 2/2018 | Frank et al. |
| 2004/0036977 A1 | 2/2004 | Tanaka et al. |
| 2009/0284727 A1 | 11/2009 | Muramatsu et al. |
| 2013/0093113 A1* | 4/2013 | Hayashi ................ G03F 7/0002 264/40.1 |
| 2014/0177022 A1 | 6/2014 | Saisho et al. |
| 2015/0001408 A1 | 1/2015 | Frank et al. |
| 2016/0046045 A1 | 2/2016 | Matsumoto |

FOREIGN PATENT DOCUMENTS

| | | |
|---|---|---|
| JP | 2005189847 A | 7/2005 |
| JP | 5686779 B2 | 3/2015 |
| TW | 201512786 A | 4/2015 |

OTHER PUBLICATIONS

Office Action issued in Chinese Appln. No. 201710207996.7 dated Jul. 18, 2019. English translation provided.

Written Opinion and Search Report issued in Singapore Appln. No. 10201702161R dated Dec. 12, 2017.

Office Action issued in Japanese Appln. No. 2016-073177 dated Dec. 2, 2019.

* cited by examiner

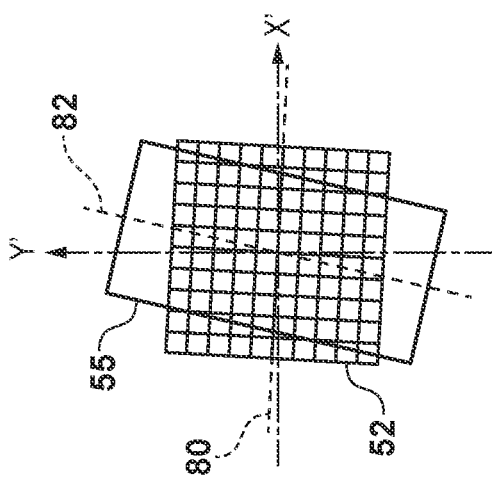 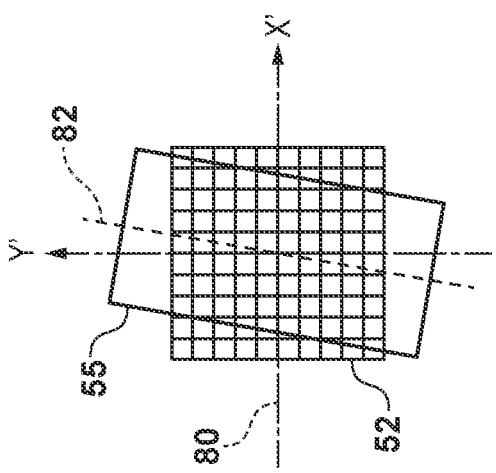 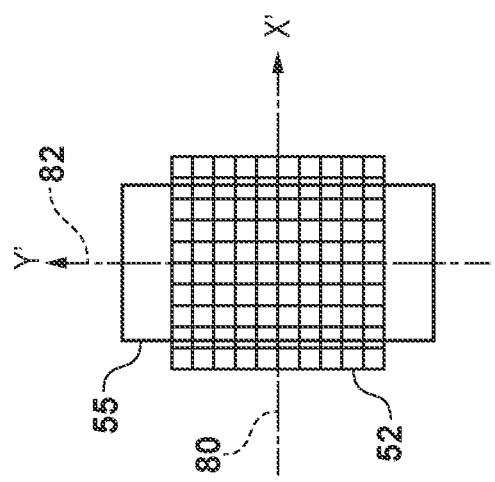
FIG. 13A  FIG. 13B  FIG. 13C
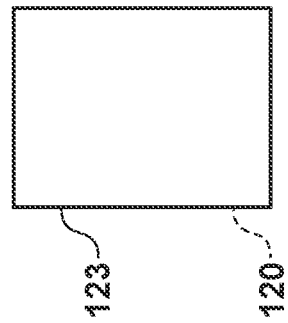 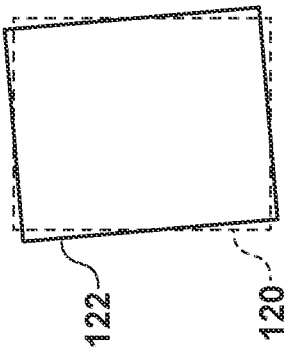 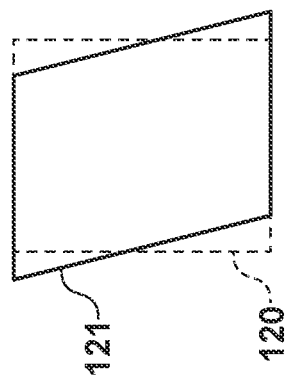

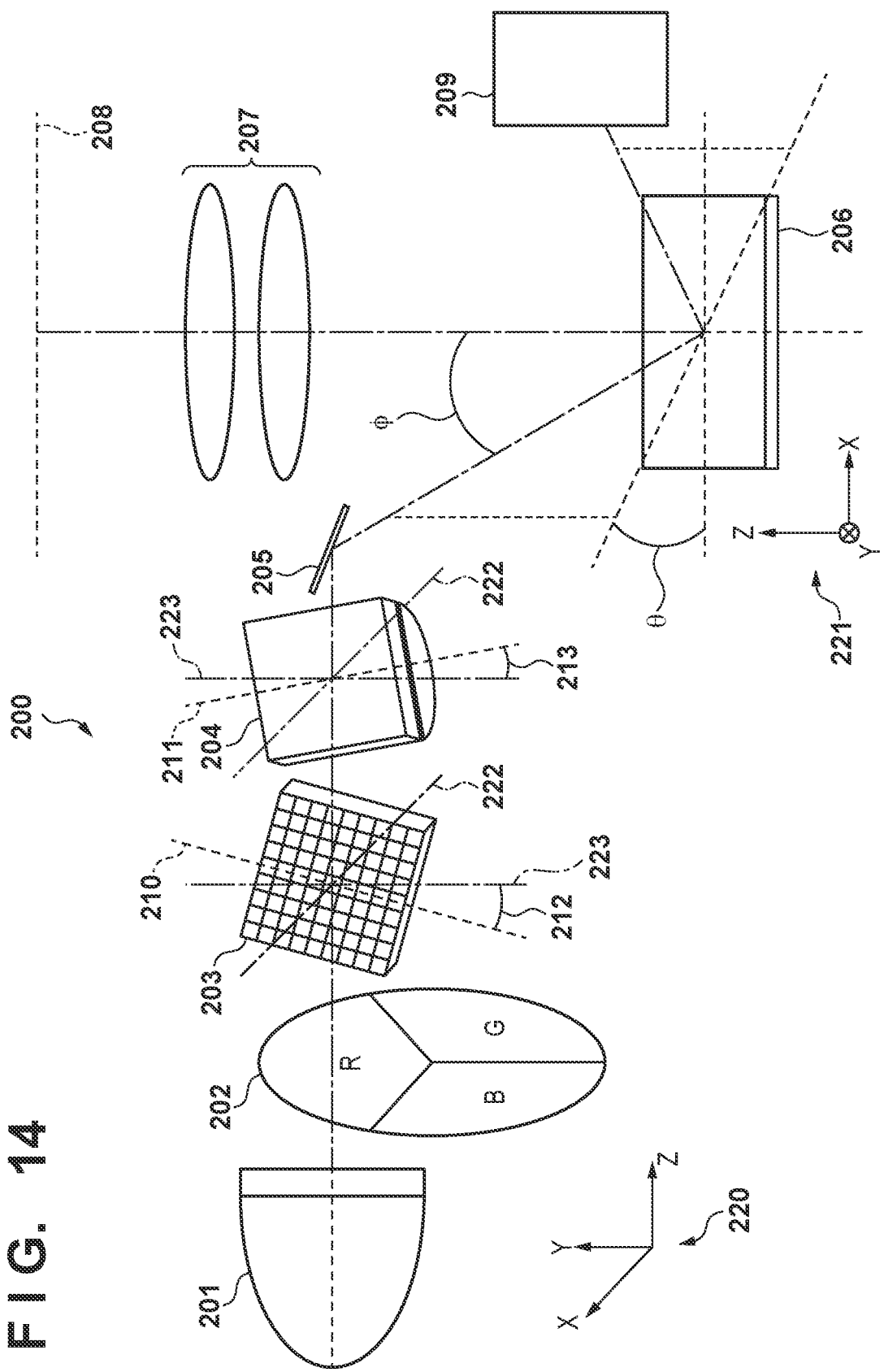

US 10,761,316 B2

ILLUMINATION APPARATUS, OPTICAL APPARATUS, IMPRINT APPARATUS, PROJECTION APPARATUS, AND METHOD OF MANUFACTURING ARTICLE

BACKGROUND OF THE INVENTION

Field of the Invention

The present invention relates to an illumination apparatus, an optical apparatus, an imprint apparatus, a projection apparatus, and a method of manufacturing an article.

Description of the Related Art

There are increasing demands for the miniaturization of semiconductor devices, MEMS, and the like. Attentions are therefore paid to a microfabrication technique of forming a pattern (structure) on a substrate by molding and curing an imprint material on a substrate using a mold, in addition to a conventional photolithography technique. This technique is called an imprint technique, which can form fine patterns on substrates on the order of several nanometers.

An imprint apparatus needs to match the shape of a pattern region (shot region) formed on a substrate in advance with the shape of a pattern region of a mold in the step of bringing a mold into contact with an imprint material on the substrate. In order to improve such overlay accuracy, Japanese Patent No. 5686779 has proposed an imprint apparatus which includes a mechanism for deforming a pattern region of a mold by adding a force to the mold and a mechanism for deforming a pattern region on a substrate by heating the substrate. For example, a micro-mirror device is incorporated in such a mechanism for deforming a pattern region on a substrate to adjust the intensity distribution of light heating the substrate.

A micro-mirror device as one type of MEMS is used in a wide range of fields including display devices, projector apparatuses, and exposure apparatuses. A micro-mirror device is formed by two-dimensionally arranging rectangular mirrors. The arranging direction of the mirrors differs from the direction of the drive axis of each mirror. The micro-mirror device preferably illuminated from a direction perpendicular to the direction of the drive axis of each mirror. Therefore, the micro-mirror device is illuminated from a direction (angle) different from the arranging direction of the mirrors. Since the drive axis of each mirror generally tilts at 45° with respect to the arranging direction of the mirrors, the micro-mirror device is illuminated from a direction at 45° relative to the arranging direction of the mirrors.

A micro-mirror device to be used for an optical system is selected in accordance with a plurality of factors such as the size and resolution of each mirror and the arrangement and cost of the optical system. In general, in an optical system using a micro-mirror device, light is preferably reflected from the array plane in which the mirrors are arranged in the vertical direction while the mirrors are driven. For this reason, it is necessary to obliquely illuminate the micro-mirror device from a direction different from the arranging direction of the mirrors. In this case, a shine-proof optical system is used to prevent an illumination shape on the array plane of the micro-mirror device from distorting due to defocusing.

As described above, when performing oblique illumination, a shine-proof optical system is used to illuminate an illumination plane with a predetermined illumination shape. Forming a shine-proof optical system, however, can lead to increases in the cost and size of an apparatus with an increase in the number of lenses in the optical system.

SUMMARY OF THE INVENTION

The present invention provides, for example, an illumination apparatus advantageous in oblique illumination.

According to one aspect of the present invention, there is provided an illumination apparatus which performs oblique illumination, the apparatus including a first optical element formed with an array of a plurality of optical components each configured to generate a point light source, and a second optical element configured to receive light from the first optical element and form an illumination region, with a power thereof in one direction being different from a power thereof in a direction perpendicular to the one direction, wherein at least one of the first optical element and the second optical element has a rotation angle about an optical axis thereof so as to perform compensate for distortion of the illumination region by the oblique illumination.

Further aspects of the present invention will become apparent from the following description of exemplary embodiments with reference to the attached drawings.

BRIEF DESCRIPTION OF THE DRAWINGS

FIGS. 13A to 13C are views showing the arrangement of the MLA and the cylindrical lens and an illumination shape according to this embodiment.

FIG. 14 is a schematic view showing the arrangement of a projector apparatus as an aspect of the present invention.

DESCRIPTION OF THE EMBODIMENTS

Preferred embodiments of the present invention will be described below with reference to the accompanying draw-

First Embodiment

Figure 1:
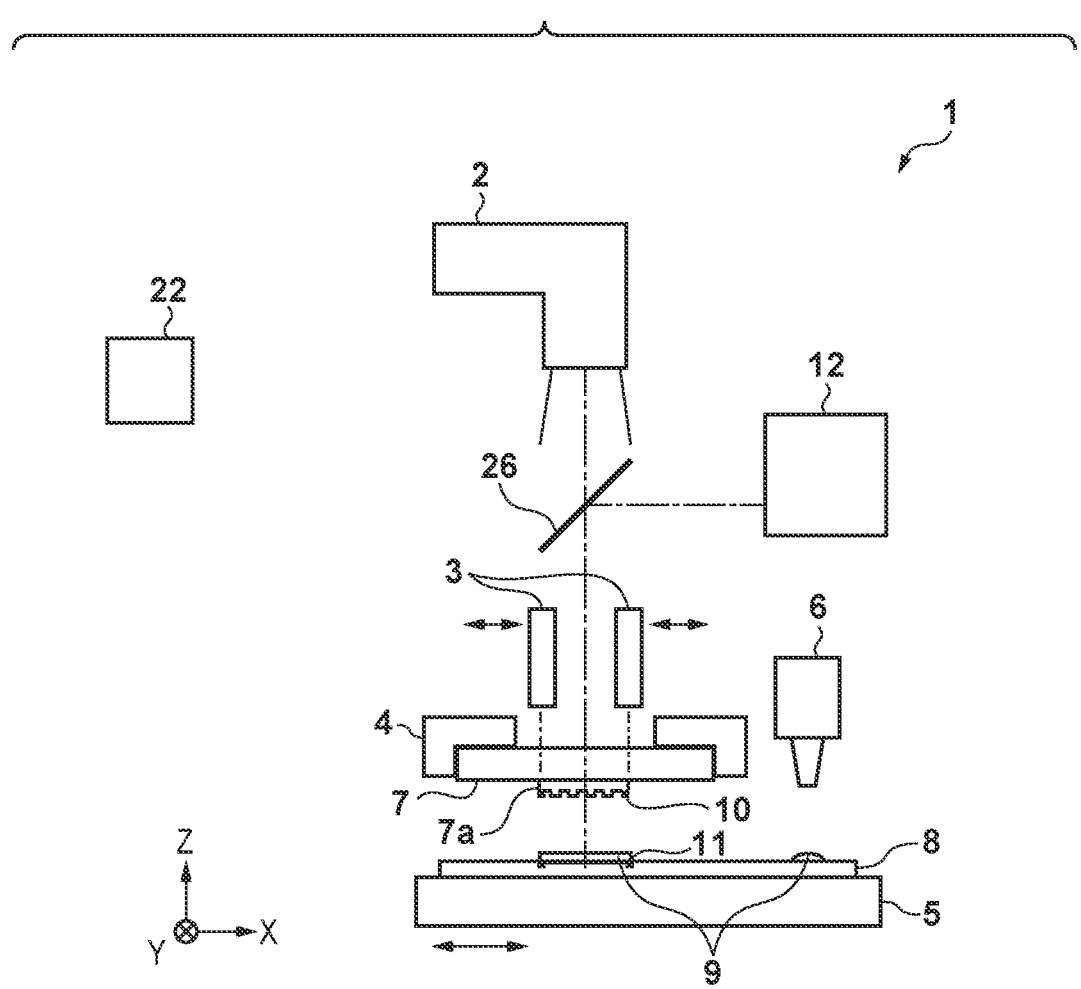
FIG. 1 is a schematic view showing the arrangement of an imprint apparatus as an aspect of the present invention.

FIG. 1 is a schematic view showing the arrangement of an imprint apparatus 1 as an aspect of the present invention. The imprint apparatus 1 is a lithography apparatus used for the manufacture of devices such as semiconductor devices. This apparatus molds an uncured imprint material on a substrate by using a mold and forms a pattern of the imprint material on the substrate. This embodiment uses, as an imprint material curing method, a photo-curing method of curing an imprint material by irradiating it with light (for example, ultraviolet light).

As shown in FIG. 1, the imprint apparatus 1 includes an irradiation unit 2, an alignment measurement unit 3, a mold holding unit 4, a substrate stage 5, a supply unit 6, a substrate heating unit 12, and a control unit 22. In the following description, directions orthogonal to each other within a plane parallel to a mold and a substrate are defined as the X- and Y-axes, respectively, and a direction perpendicular to the X- and Y-axes is defined as the Z-axis.

The irradiation unit 2 irradiates a mold 7 with ultraviolet light to cure an imprint material 9 on a substrate while the mold 7 is in contact with the imprint material 9. The irradiation unit 2 includes a light source and a plurality of optical elements for uniformly irradiating the imprint material 9 with ultraviolet light, in a predetermined shape, emitted from the light source. The irradiation region (irradiation range) irradiated with ultraviolet light by the irradiation unit 2 is almost equal to or slightly larger than the area of a pattern region 7a of the mold 7. This is because the irradiation region irradiated with ultraviolet light is minimized to suppress the occurrence of the positional shift or distortion of a pattern transferred onto the imprint material 9 on a substrate 8 upon thermal expansion of the mold 7 and the substrate 8 caused by heat generated by irradiation with ultraviolet light. Another reason is to suppress the occurrence of abnormality in the operation of the supply unit 6 when the imprint material 9 in the supply unit 6 is cured by ultraviolet light reflected by the substrate 8 and reaching the supply unit 6. In this case, a light source to be used includes, for example, a high-pressure mercury lamp, various types of excimer lamps, an excimer laser, and a light-emitting diode. A light source is properly selected in accordance with the properties of an imprint material, and the types, number, and wavelengths of light sources to be used are not specifically limited.

The mold 7 is a mold having the pattern region 7a in which a predetermined three-dimensional pattern (for example, a concave-convex pattern such as a circuit pattern) is formed on the surface facing the substrate 8. The mold 7 is formed from a material which can transmit ultraviolet light, for example, quarts.

The mold holding unit 4 attracts and holds the mold 7 with a vacuum suction force or electrostatic force. The mold holding unit 4 includes, for example, a mold chuck and a mold driving unit which drives the mold chuck to bring the mold 7 into contact with an imprint material on a substrate. The mold holding unit 4 further includes a magnification correction unit which corrects the shape (distortion) of a pattern transferred onto the imprint material 9 by deforming the mold 7 in the X-axis direction and the Y-axis direction. Molding and releasing operations in the imprint apparatus 1 each may be implemented by moving the mold 7 held by the mold holding unit 4 in the Z-axis direction or by moving the substrate 8 held by the substrate stage 5 in the Z-axis direction. Alternatively, molding and releasing operations each may be implemented by moving both the mold 7 and the substrate 8 in the Z-axis direction.

The substrate stage 5 is a stage which holds the substrate 8 by, for example, vacuum suction and can move in an X-Y plane. The substrate 8 includes, for example, a single crystal silicon substrate, to which the imprint material 9 molded by the mold 7 is supplied.

The alignment measurement unit 3 performs measurement for the relative alignment between the mold 7 and the substrate 8. The alignment measurement unit 3 optically detects alignment marks 10 and 11 respectively provided on the mold 7 and the substrate 8 to measure their relative positions. The alignment measurement unit 3 is arranged such that its measurement axis (optical axis) becomes perpendicular to the mold 7 or the substrate 8. The alignment measurement unit 3 is configured to be driven in the X-axis direction and the Y-axis direction in accordance with the positions of the alignment marks 10 and 11 and to be also driven in the Z-axis direction to adjust the focus at the positions of the alignment marks 10 and 11. The substrate stage 5 and the mold holding unit 4 (magnification correction unit) are controlled based on the relative positions of the mold 7 and the substrate 8 which are measured by the alignment measurement unit 3.

The supply unit 6 supplies the uncured imprint material 9 onto a substrate. In this embodiment, the imprint material 9 is an ultraviolet curable resin material having the property of being cured by irradiation with ultraviolet light. However, an imprint material is properly selected in accordance with the type of semiconductor device or the like. In addition, in the embodiment, the supply unit 6 is provided inside the imprint apparatus 1. However, the supply unit 6 may be provided outside the imprint apparatus 1 so as to introduce the substrate 8, to which the imprint material 9 is supplied in advance, into the imprint apparatus 1. This eliminates the step of supplying the imprint material 9 inside the imprint apparatus 1, and hence can quicken the processing in the imprint apparatus 1. In addition, since the supply unit 6 is unnecessary, the overall cost of the imprint apparatus 1 can be reduced.

Figure 2:
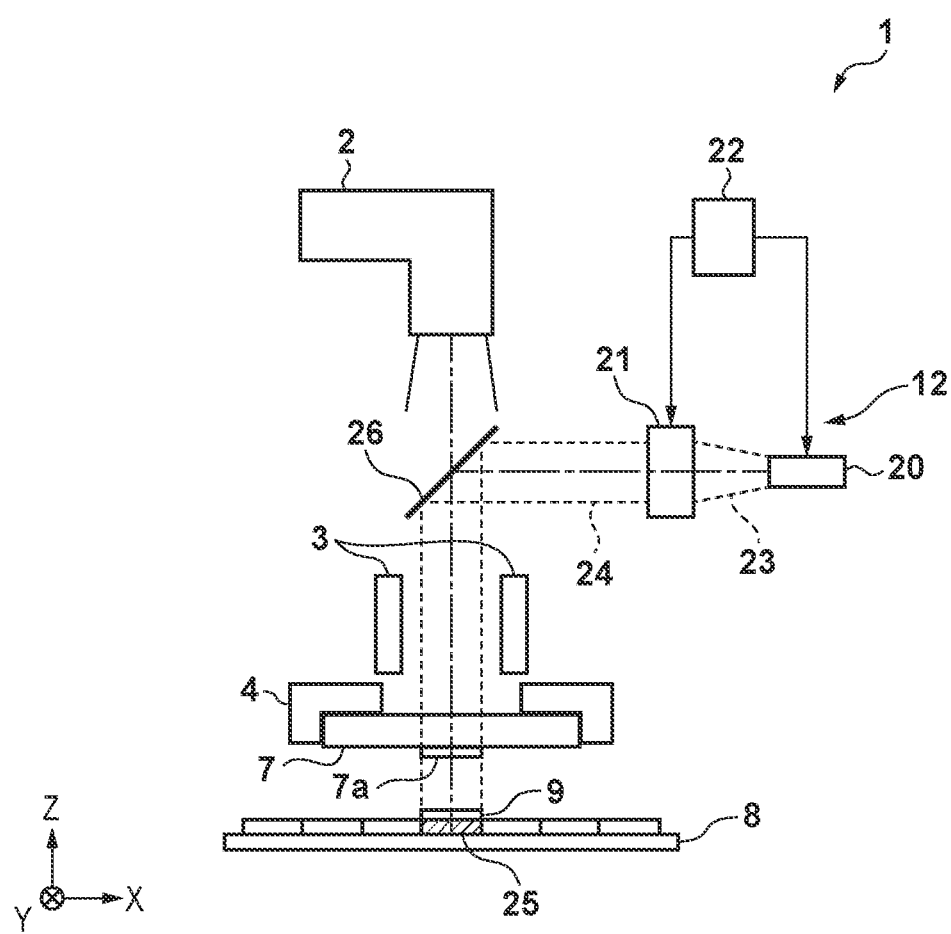
FIG. 2 is a schematic view showing the arrangement of a substrate heating unit of the imprint apparatus shown in FIG. 1.

FIG. 2 is a schematic view showing the arrangement of the substrate heating unit 12 in the imprint apparatus 1. The substrate heating unit 12 deforms a pattern region (shot region) 25 formed on the substrate 8 in advance by heating the substrate 8 loaded into the imprint apparatus 1. The substrate heating unit 12 includes a heating light source 20 which irradiates the substrate 8 with light 23 to heat the substrate 8, an adjusting unit 21 which adjusts the irradiation amount (irradiation amount distribution) of the light 23, and a reflecting plate 26 which defines an optical path to guide light 24 from the adjusting unit 21 to the substrate 8.

The heating light source 20 emits light having a wavelength to which the imprint material 9, as an ultraviolet curing resin material, is not photosensitive (cured), for example, light in a wavelength band of 400 nm to 2,000 nm. The heating light source 20 preferably emits light in a wavelength band of 500 nm to 800 nm from the viewpoint of heating efficiency. Note, however, that light emitted from the heating light source 20 is not limited to the above wavelength bands. For example, the heating light source 20 may emit light in a wavelength band, of a wavelength band of 200 nm to 400 nm to which the imprint material 9 is photosensitive, to which the imprint material 9 is difficult to be photosensitive.

The adjusting unit 21 allows only specific light of the light 23 to irradiate the substrate 8 in order to form a predetermined irradiation amount distribution on the substrate. The adjusting unit 21 includes, for example, a mirror array having an array of a plurality of mirrors each including a drive axis, a so-called digital mirror device (digital micromirror device). The digital mirror device can control (change) an irradiation amount distribution by individually adjusting the plane direction of each mirror.

The control unit 22 is formed from a computer including a CPU and a memory, and controls the overall imprint apparatus 1. The control unit 22 performs imprint processing by controlling each unit of the imprint apparatus 1 in accordance with a program and the like. In this embodiment, the control unit 22 controls the substrate heating unit 12 to form the pattern region 25 formed on the substrate 8 in advance into a predetermined shape. The control unit 22 may be integrally formed with another portion of the imprint apparatus 1 (inside a common housing) or may be formed separately from another portion of the imprint apparatus 1 (in another housing).

Imprint processing in the imprint apparatus 1 will be described. First of all, a substrate transfer unit (not shown) transfers the substrate 8 onto the substrate stage 5 to let it hold (fix) the substrate 8. The substrate stage 5 is then moved to a position below the supply unit 6 (the supply position of the imprint material 9), and the imprint material 9 is supplied onto the pattern region 25 corresponding to a shot region on the substrate. The substrate stage 5 is then moved to locate the pattern region 25 on the substrate 8 at a position below the mold 7. Subsequently, the mold holding unit 4 is driven (lowered) in the Z-axis direction to bring the mold 7 into contact with the imprint material 9 on the substrate. When the mold 7 comes into contact with the imprint material 9, the imprint material 9 is filled into the pattern region 7a (the concave portions of the pattern) of the mold 7. In addition, while the mold 7 is in contact with the imprint material 9, the alignment measurement unit 3 detects the alignment marks 10 and 11 to perform alignment between the mold 7 and the substrate 8 and magnification correction for the mold 7 by using the magnification correction mechanism.

Upon satisfactory execution of filling of the pattern region 7a of the mold 7 with the imprint material 9, alignment between the mold 7 and the substrate 8, and magnification correction for the mold 7, the irradiation unit 2 irradiates the imprint material 9 with ultraviolet light via the mold 7 to cure the imprint material 9. In this case, the alignment measurement unit 3 is driven to retreat so as not to block the optical path of ultraviolet light. The mold holding unit 4 is then driven (raised) in the Z-axis direction to release the mold 7 from the imprint material 9 cured on the substrate. With this operation, the pattern of the mold 7 is transferred onto the substrate.

The substrate 8 subjected to imprint processing in the imprint apparatus 1 undergoes, for example, a film deposition step such as sputtering, that is, a step including heat treatment, in a device manufacturing process, and is loaded into the imprint apparatus 1. As a consequence, the substrate 8 loaded into the imprint apparatus 1 has expanded or contracted, and hence the pattern region 25 has sometimes deformed (the shape or size of the pattern region 25 has sometimes changed) in two directions orthogonal to each other in an X-Y plane. Such deformation of the pattern region 25 is mainly classified into a magnification component, a parallelogram component, and a trapezoidal component. These components are sometime combined with each other.

When bringing the mold 7 into contact with the imprint material 9 on the substrate, the imprint apparatus 1 needs to correct the shape of the pattern region 25 on the substrate 8 to match it with the shape of the pattern region 7a of the mold 7. More specifically, a correction amount for the shape of the pattern region 25 on the substrate 8 is obtained from the measurement result obtained by the alignment measurement unit 3 under the control of the control unit 22. The apparatus then thermally deforms the pattern region 25 by making the substrate heating unit 12 heat the substrate 8 based on the correction amount.

Figure 3:
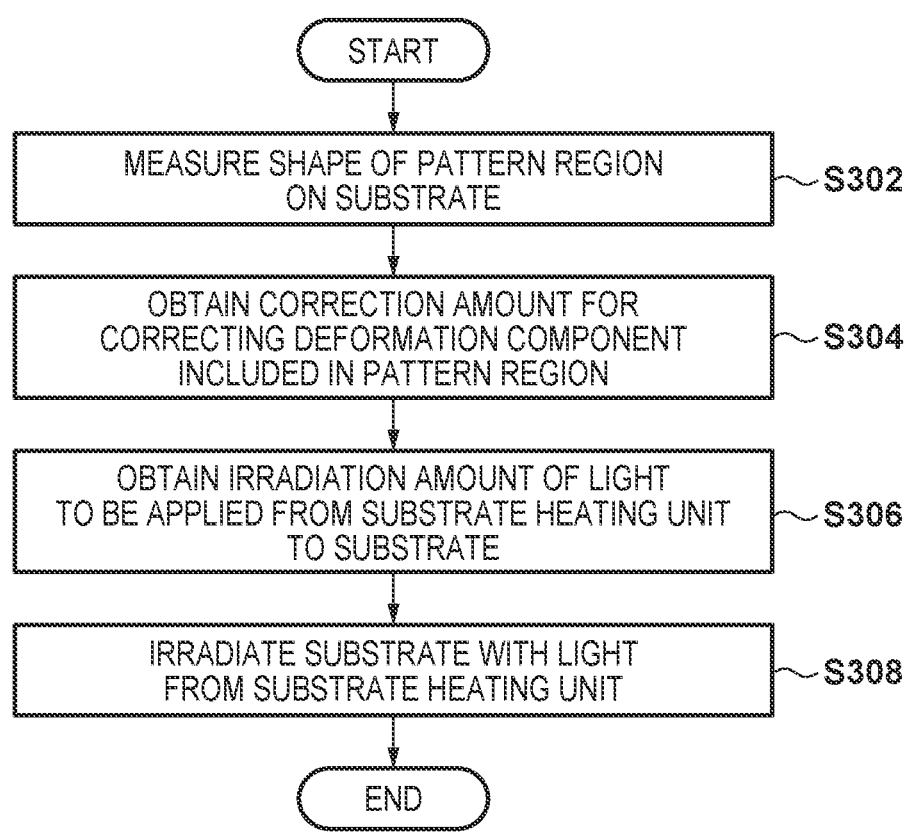
FIG. 3 is a flowchart for explaining the processing of correcting the shape of a pattern region on a substrate.

The processing of correcting the shape of the pattern region 25 on the substrate 8 in the imprint apparatus 1 will be described with reference to FIG. 3. The control unit 22 performs such processing by comprehensively controlling the respective units of the imprint apparatus 1. In addition, in this embodiment, a temperature distribution for obtaining a predetermined correction amount inside and outside the pattern region 25 is formed to correct the shape of the pattern region 25 on the substrate 8, that is, a deformation component.

In step S302, the alignment measurement unit 3 detects the alignment mark 11 provided on the substrate 8 to measure the shape of the pattern region 25 on the substrate 8. In this embodiment, the alignment measurement unit 3 measures the shape of the pattern region 25. However, this is not exhaustive. An external measurement device may be used to measure the shape of the pattern region 25. In step S304, a deformation component included in the pattern region 25 is analyzed based on the shape of the pattern region 25 on the substrate 8 which is measured in step S302, and a correction amount for correcting the deformation component is obtained. In step S306, the irradiation amount of light which should be applied from the substrate heating unit 12 to the substrate 8 is obtained based on information representing the relationship between the correction amount obtained in step S304, the correction amount for correcting the deformation component included in the pattern region 25, and the irradiation amount (irradiation amount distribution) of light which irradiates the substrate 8. In step S308, the substrate heating unit 12 (adjusting unit 21) is controlled with reference to the irradiation amount obtained in step S306 as an index to irradiate the substrate 8 with light from the substrate heating unit 12. With this operation, the inside and the outside of the pattern region 25 on the substrate 8 are irradiated with the light 24 whose irradiation amount is adjusted, thereby forming an irradiation amount distribution.

Figure 4A:
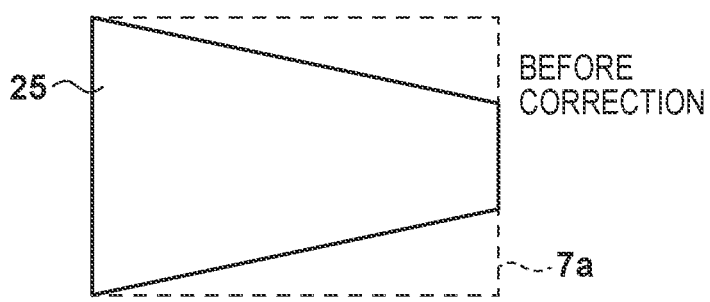
FIGS. 4A to 4E are views for specifically explaining the processing of correcting the shape of a pattern region on a substrate.
Figure 4B:
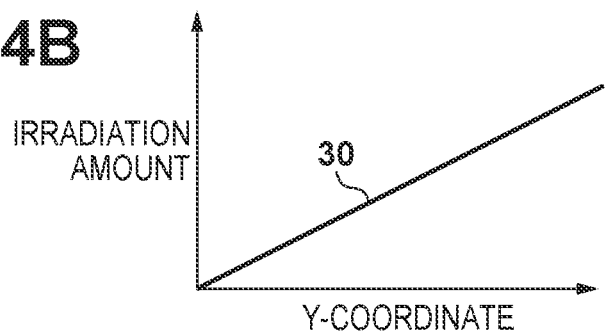

A case in which the shape of the pattern region 25 including only a trapezoidal component as a deformation component as shown in FIG. 4A is corrected will be described in detail below. Assume that the pattern region 25 includes a trapezoidal component only in the Y-axis direction (Y-coordinate), and has no deformation in the X-axis direction. As shown in FIG. 4A, the trapezoidal component included in the pattern region 25 has a side (upper base) on the positive side in the Y-axis direction which is shorter than a side (lower base) on the negative side in the Y-axis direction. Therefore, a correction amount for matching the upper base with the lower base (restoring a normal state) is obtained. The irradiation amount of light to be applied from the substrate heating unit 12 to the substrate 8 is obtained based on the correction amount. Light is then applied from the substrate heating unit 12 to the substrate 8 with reference to the obtained irradiation amount as an index to form an irradiation amount distribution 30 only in the Y-axis direction, as shown in FIG. 4B. The irradiation amount distribution 30 has the maximum correction amount at the upper base portion, and gradually decreases in correction amount from the upper base to the lower base, and hence has a linear shape like that shown in FIG. 4B. Note that since the pattern region 25 includes no trapezoidal component in the X-axis direction, a uniform irradiation amount may be set.

Figure 4C:
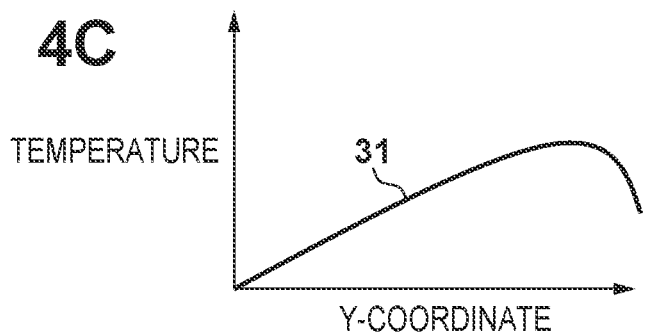
Figure 4D:
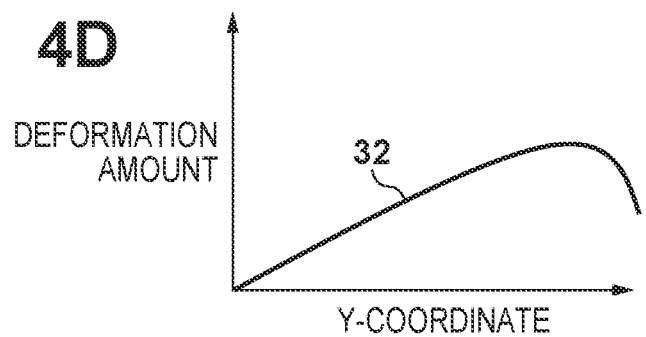
Figure 4E:
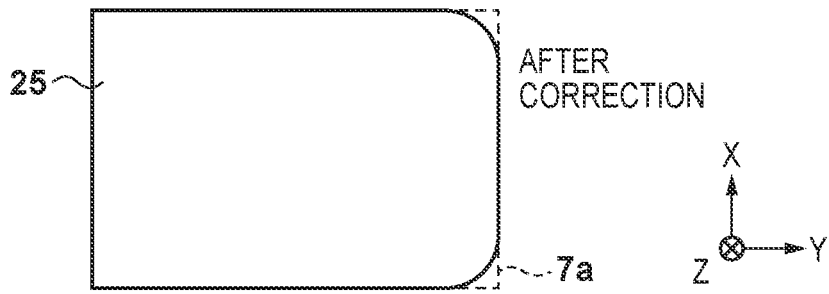

When the pattern region 25 is irradiated with light which forms the irradiation amount distribution 30, a temperature distribution 31 like that shown in FIG. 4C is formed on the pattern region on the substrate 8. In this case, the reason why the temperature distribution 31 descends near the upper base instead of uniformly rising from the lower base to the upper base is that a region outside the pattern region 25 is not irradiated with light (that is, not heated), and the temperature outside the pattern region 25 descends due to heat dissipation. The temperature distribution 31 formed on the substrate causes the pattern region 25 to thermally deform in the form of a deformation amount distribution 32 like that shown in FIG. 4D. This makes it possible to correct the pattern region 25 into a shape like that shown in FIG. 4E. Referring to FIG. 4E, although deformations are left in the two ends of the upper base of the pattern region 25, the pattern region 25 is corrected into a shape approximate to the shape of the pattern region 7a of the mold 7. Note however that heating also a region outside the pattern region 25 can provide a linear deformation amount in the pattern region 25 and make the shape of the pattern region 25 further closer to the shape of the pattern region 7a.

Figure 5:
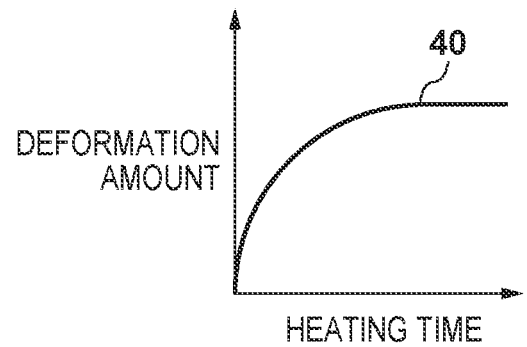
FIG. 5 is a graph for specifically explaining the processing of correcting the shape of a pattern region on a substrate.

In correction of the shape of the pattern region 25 shown in FIGS. 4A to 4E, the irradiation amount of light applied from the substrate heating unit 12 to the substrate 8 is temporally constant. Therefore, a deformation amount 40 of the pattern region 25 with respect to the heating time changes from the start of heating, but is stabilized after the lapse of a predetermined time, as shown in FIG. 5. For this reason, while the deformation amount 40 of the pattern region 25 is stabilized, the shape of the pattern region 25 is matched with the shape of the pattern region 7a of the mold 7. The imprint apparatus 1 forms a pattern of the imprint material 9 on the pattern region 25 upon correcting the shape of the pattern region 25 on the substrate 8 in this manner, and hence can accurately match the shape of the pattern region 25 with the shape of the pattern region 7a.

As described above, the imprint apparatus 1 includes a magnification correction unit which corrects the shape of the pattern region 7a of the mold 7 by applying an external force or displacement to a side surface of the mold 7. It is possible to more accurately match the shape of the pattern region 25 with the shape of the pattern region 7a by combining the correction of the shape of the pattern region 7a by the magnification correction unit and the correction of the shape of the pattern region 25 by the substrate heating unit 12. This makes it possible to accurately superimpose the pattern region 25 on the newly formed pattern of the imprint material 9.

This embodiment has described the correction of the shape of the pattern region 25 which includes only a trapezoidal component as a deformation component. However, this is not exhaustive. When, for example, correcting the shape of the pattern region 25 which includes a magnification component as a deformation component, it is preferable to irradiate the substrate 8 with light from the substrate heating unit 12 so as to form uniform temperature distributions on the inside and outside of the pattern region 25. Likewise, when, for example, correcting the shape of the pattern region 25 which includes a barrel or pincushion distortion as a deformation component, it is preferable to irradiate the substrate 8 with light from the substrate heating unit 12 so as to form a proper temperature distribution on the pattern region 25. Furthermore, in this embodiment, an irradiation amount distribution is formed only in the Y-axis direction of the pattern region 25. However, in accordance with the deformation component of the pattern region 25, an irradiation amount distribution may be formed in the X-axis direction, or irradiation amount distributions may be formed both in the X-axis direction and the Y-axis direction.

Figure 6:
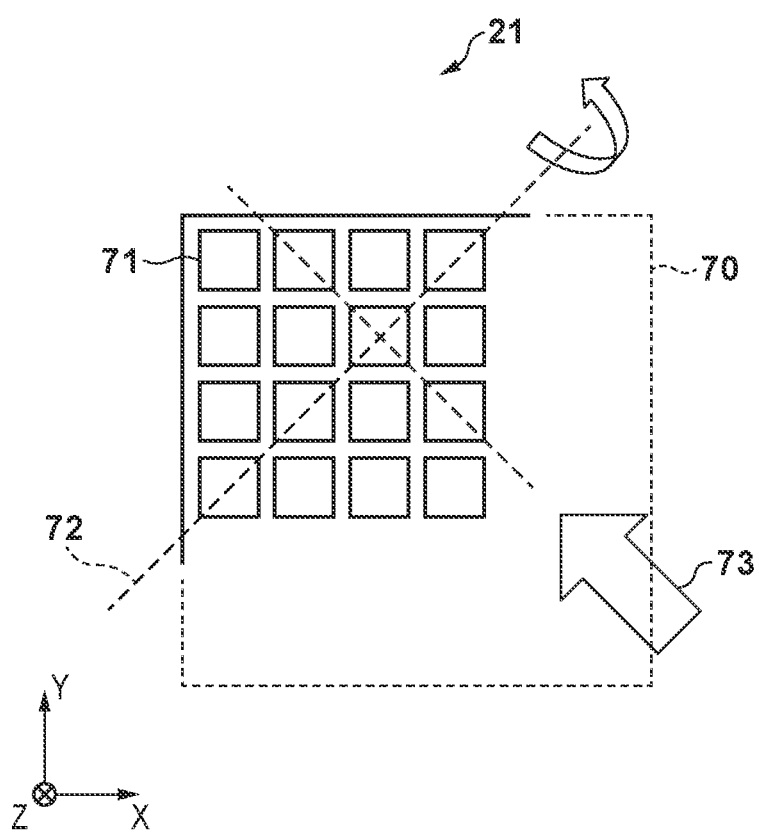
FIG. 6 is a view showing an example of the arrangement of a digital mirror device.

The arrangements of the heating light source 20 and the adjusting unit 21 of the substrate heating unit 12 will be described in detail below. The adjusting unit 21 has a function of controlling the irradiation amount distribution of light irradiating the substrate 8. This function is embodied as a digital mirror device in the embodiment. FIG. 6 is a view showing the arrangement of a digital mirror device as the adjusting unit 21. The adjusting unit 21 is formed by arranging a plurality of rectangular mirrors 71 in a mirror region (the region in which the plurality of mirrors 71 are arranged) 70 in the form of an array. The mirrors 71 each include a drive axis 72 in a diagonal direction of each mirror 71 and can rotate about the drive axis 72. The mirrors 71 each can select a state in which light is reflected in a predetermined direction and a state in which light is not reflected in the predetermined direction. In the embodiment, a state in which each mirror 71 tilts at +12° is a state in which light is reflected in a predetermined direction (ON state), and a state in which each mirror 71 tilts at −12° is a state in which light is not reflected in the predetermined direction (OFF state).

Light illuminating the mirror region 70 (adjusting unit 21) preferably enters from a direction 73 perpendicular to the drive axis 72 of each mirror 71. Therefore, the mirror region 70 is illuminated with light from a direction (angle) different from the arranging direction of the plurality of mirrors 71. In this embodiment, the first and second arranging directions of the plurality of mirrors 71 are respectively set at 0° and 90°. In addition, the drive axis 72 of each mirror 71 tilts at 45° from the first arranging direction. Therefore, the mirror region 70 is obliquely illuminated from a direction (angle) 73 at −45° with respect to the first arranging direction.

Figure 7:
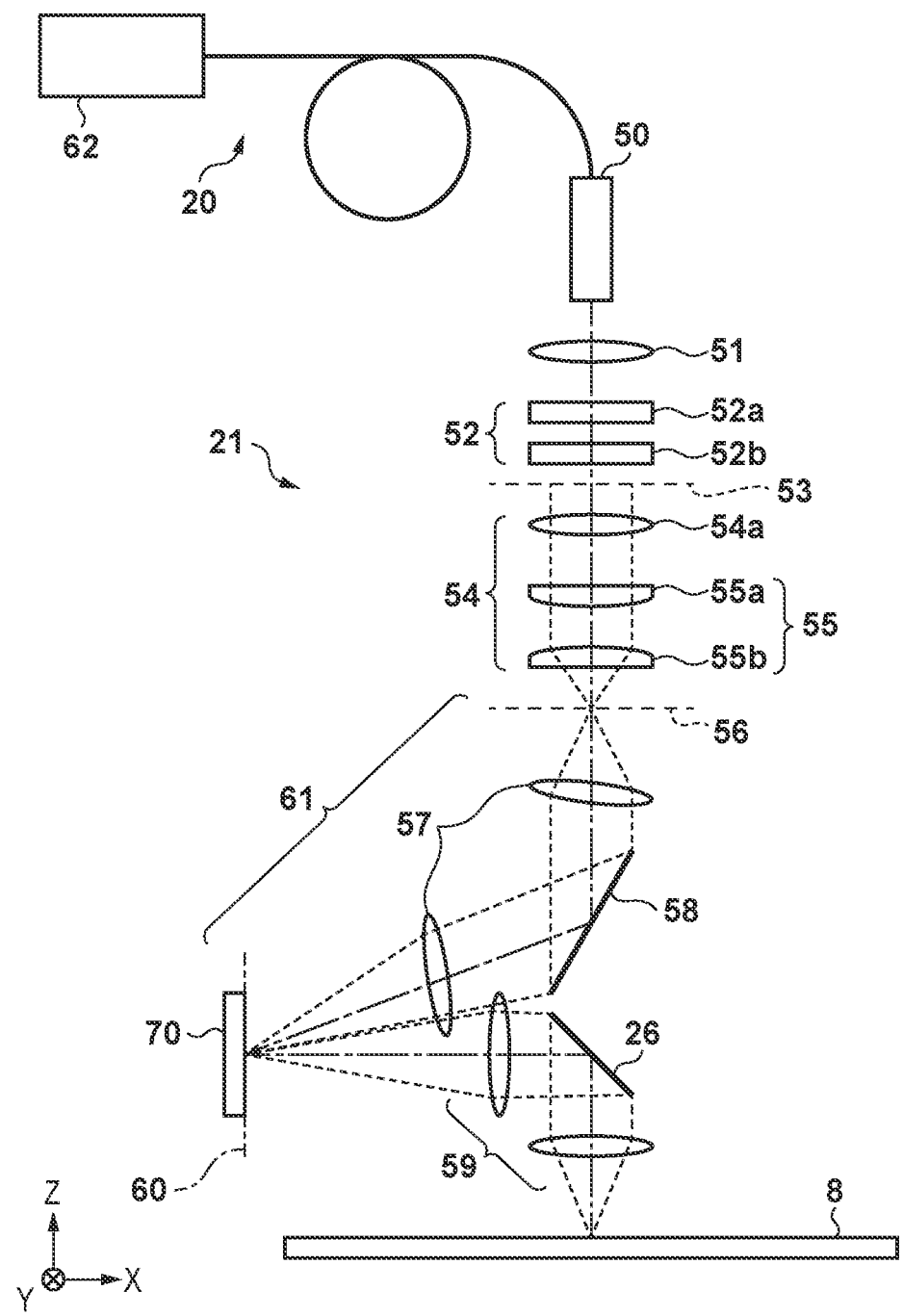
FIG. 7 is a schematic view showing the arrangement of the optical system of the substrate heating unit including a shine-proof optical system.

The arrangement of the substrate heating unit 12 including a digital mirror device as the adjusting unit 21 will be described. FIG. 7 is a schematic view showing the arrangements of the heating light source 20 and the optical system of the adjusting unit 21. The coordinate system shown in FIG. 7 indicates a coordinate system on a substrate surface. A large amount of heat is required to thermally deform the substrate 8 by heating. In order to obtain such an amount of heat by irradiating the substrate 8 with light, it is necessary to increase the intensity of the heating light source 20. In addition, the throughput of the imprint apparatus 1 has its desired value. For this reason, it is required to obtain a target thermal deformation in a short period of time, and hence it is required to increase the intensity of the heating light source 20 and improve the illumination efficiency of the optical system.

This embodiment uses a high-power laser light source 62 as the heating light source 20. However, since the laser light source 62 generates a large amount of heat, there is a concern about the influence of heat on the superimposition accuracy in the imprint apparatus 1. For this reason, the laser light source 62 is arranged away from the imprint space including the optical system, and light from the laser light source 62 is routed via a fiber 50.

Both the intensity distribution and the angle distribution of light from the fiber 50 are nonuniform. If light illuminating the mirror region 70 exhibits illuminance unevenness, some constraints are imposed on the formation of a predetermined intensity distribution on a substrate surface. For example, in order to form a uniform intensity distribution on the substrate surface, it is necessary to match the mirror region 70 with the lowest illuminance, resulting in a decrease in illumination efficiency. It is therefore required for light illuminating the mirror region 70 to have a uniform intensity distribution. In order to make light illuminating the mirror region 70 have a uniform intensity distribution, for example, a homogenizer optical element such as an MLA (MicroLens Array) and an integrator optical system are used. An MLA is an optical element having an array of a plurality of optical elements each of which generates a point light source.

An MLA 52 is illuminated with light from the fiber 50. In this embodiment, a lens 51 is used to perform Kohler illumination on the MLA 52. The MLA 52 includes an MLA 52a and an MLA 52b. The MLAs 52a and 52b each have one surface as an assembly of micro convex lenses and the other surface as a flat surface. Note however that an MLA having curvatures on the two surfaces can be used singly as the MLA 52. Alternatively, a fly-eye lens or a combination of many cylindrical type columnar lenses may be used in place of an MLA.

A Fourier transform optical system 54 forms a Fourier transform plane 56 to optically integrate light from a plurality of point light sources (bright spots) formed on an exit plane 53 of the MLA 52. The Fourier transform optical system 54 includes a lens 54a and a cylindrical lens 55. The cylindrical lens 55 is an optical element which receives light from the MLA 52 and forms an illumination region, with power in one direction differing from power in a direction perpendicular to the one direction. The cylindrical lens 55 is constituted by two lenses, namely cylindrical lenses 55a and 55b, in this embodiment. However, the cylindrical lens 55 may be constituted by one lens or three or more lenses.

When each micro lens element of the MLA 52 has a square shape, the Fourier transform plane 56 is a square illumination shape. Each shot region on the substrate 8 generally has a rectangular shape with a size of 26 mm×33 mm. From the viewpoint of illumination efficiency, light illuminating the mirror region 70 preferably has a shape similar to the size of each shot region. Two techniques are conceivable to change the illumination shape of the Fourier transform plane 56. The first one is to make each micro lens element of the MLA 52 have a rectangular shape. This however increases the manufacturing difficulty of the MLA 52 and hence tends to lead to an increase in cost. The second one is to change the aspect ratio of light by using an optical element having a curvature (power) in one direction, such as a cylindrical lens, in the Fourier transform optical system 54. Although this embodiment uses a cylindrical lens, it is possible to use an anamorphic lens or toric lens.

As shown in FIG. 7, the mirror region 70 is illuminated with light from the Fourier transform plane 56 which is optically integrated by the MLA 52 and the Fourier transform optical system 54. In order to variably change an intensity distribution on a substrate surface by controlling the drive of each of the plurality of mirrors 71 arranged in the mirror region 70, the mirror region 70 and the substrate 8 are set in an almost conjugate relation. The mirror region 70 is obliquely illuminated to illuminate the substrate 8 with light reflected by the plurality of mirrors 71 arranged in the mirror region 70.

Figure 8:
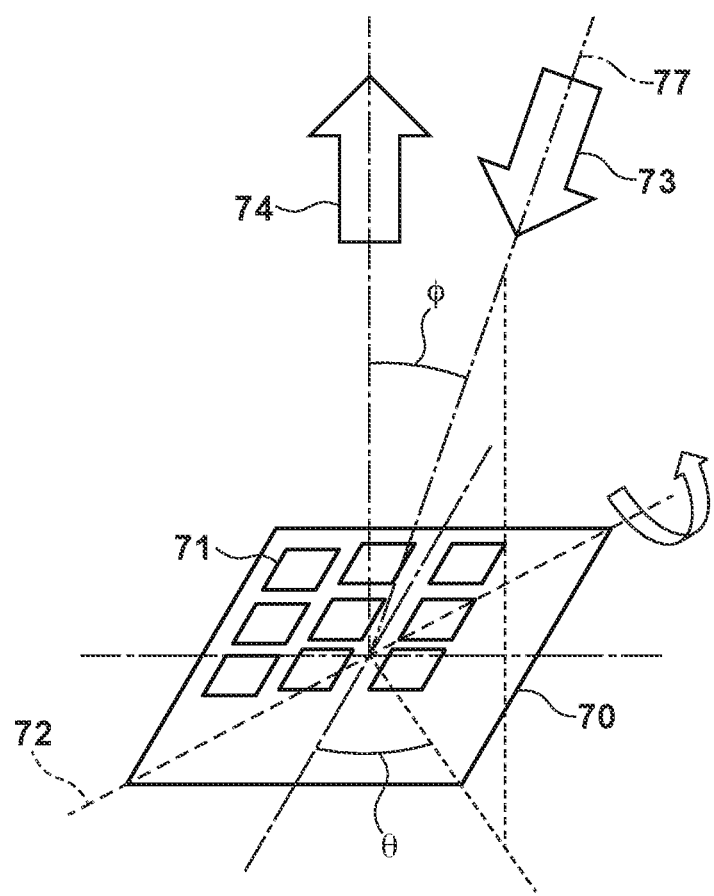
FIG. 8 is a view for explaining oblique illumination with respect to the digital mirror device (mirror region).

FIG. 8 is a view for explaining oblique illumination for the mirror region 70. As described above, each of the plurality of mirrors 71 arranged in the mirror region 70 has the drive axis 72 in a diagonal direction of the mirror 71. The mirror region 70 is illuminated from a direction rotated from the arranging direction (Y-axis) of the plurality of mirrors 71 through an angle θ in an X-Y plane. In this embodiment, the angle θ is 45°. In addition, the mirror region 70 is obliquely illuminated from the direction 73 at an angle φ with respect to the Z-axis (the normal to the mirror region 70). In the embodiment, the angle φ is 24°. In other words, the embodiment has an optical axis having an azimuth of 45° with respect to one side of the rectangle of the mirror region 70 and an elevation angle of 24° with respect to the normal to the mirror region 70 (illumination plane). An optical axis 77 tilting at the angle φ with respect to the Z-axis is the optical axis of the optical system including the plurality of optical elements for obliquely illuminating the mirror region 70. Light 74 reflected by each of the plurality of mirrors 71 arranged in the mirror region 70 travels along the Z-axis. The light 74 coincides with the Z-axis in FIG. 8.

An optical system located behind the Fourier transform plane 56 will be described by referring back to FIG. 7. An imaging optical system 59 sets the mirror region 70 and the substrate 8 in an almost conjugate relation. In order to obliquely illuminate the mirror region 70, it is necessary to set, for example, the Fourier transform plane 56 and the mirror region 70 in a shine-proof relationship. In this case, using a simple imaging optical system will cause defocusing at a peripheral portion of an illumination region, resulting in distortion of an illumination shape in the mirror region 70. As a consequence, the illumination shape deviates from a rectangular shape. Light deviating from a rectangular shape decreases the illuminance efficiency of the optical system.

A shine-proof optical system 61 includes a lens 57 and a mirror 58. The lens 57 is arranged to tilt with respect to the optical axis of the optical system to perform image formation while the object plane of the Fourier transform plane 56 and the image plane of an imaging plane 60 are made to tilt. In this case, the mirror region 70 is flush with the imaging plane 60. As shown in FIG. 8, the mirror 58 is used to obliquely illuminate the mirror region 70. Since the mirror region 70 and the substrate 8 are in an almost conjugate relation, it is possible to form a predetermined intensity distribution on a substrate by controlling the drive of each of the plurality of mirrors 71 arranged in the mirror region 70.

Forming the shine-proof optical system 61 makes it possible to illuminate the mirror region 70 with a rectangular illumination shape. On the other hand, forming the shine-proof optical system 61 will increase the number of lenses of the optical system of the substrate heating unit 12, resulting in an increase in the cost of the apparatus. In addition, since an optical system is required for image formation of the mirror region 70 from the Fourier transform plane 56, the size of the apparatus increases.

For this reason, this embodiment provides an illumination apparatus which implements oblique illumination with high illumination efficiency without forming the shine-proof optical system 61 while avoiding increases in the cost and size of the apparatus.

Figure 9:
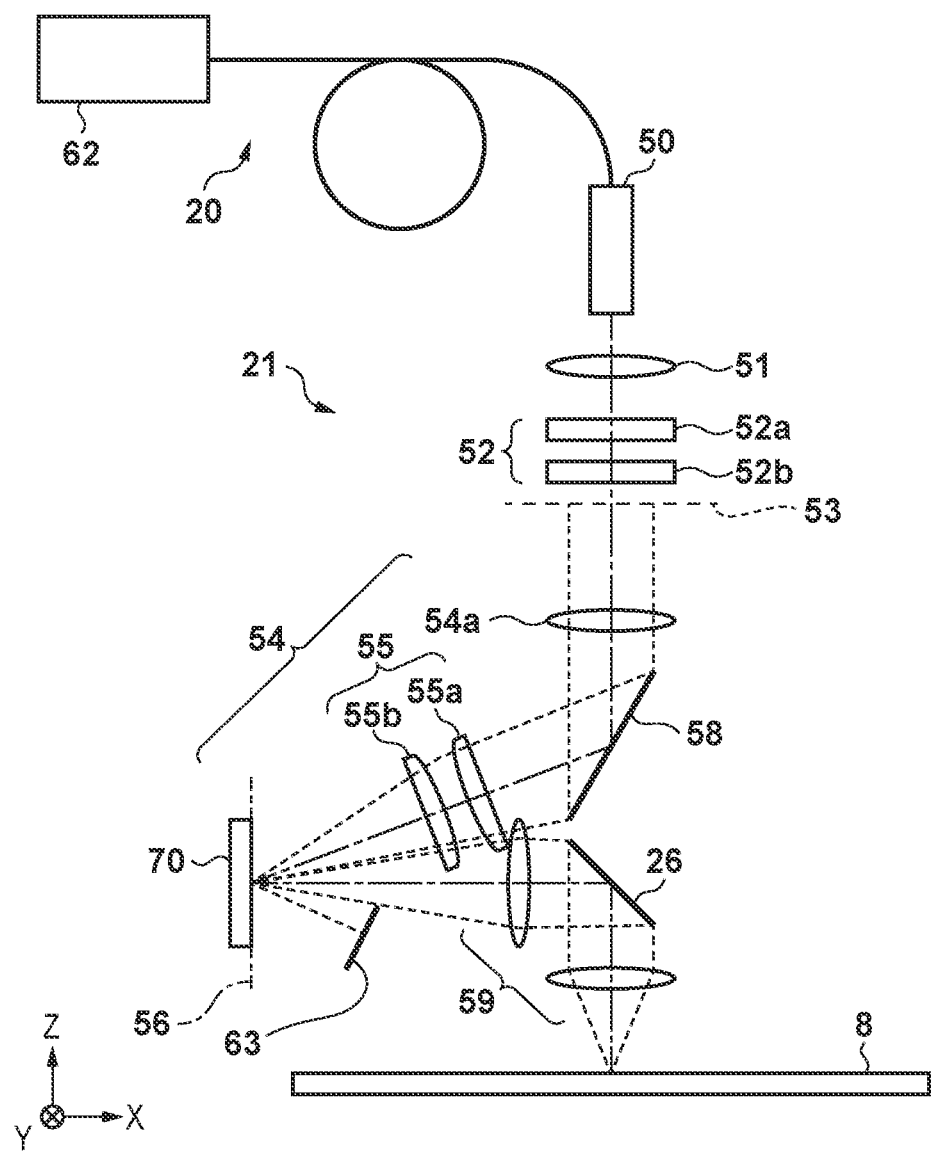
FIG. 9 is a schematic view showing the arrangement of the optical system of the substrate heating unit according to an embodiment.

FIG. 9 is a schematic view showing the arrangements of the heating light source 20 and an optical system according to this embodiment in the adjusting unit 21. As shown in FIG. 9, the optical system according to the embodiment does not include the shine-proof optical system 61. In addition, referring to FIG. 9, a light absorber 63 is arranged to absorb unnecessary light when the mirror 71 is set in the OFF state. In the embodiment, in the Fourier transform optical system 54, the mirror region 70 is illuminated with light from the exit plane 53 of the MLA 52. Therefore, the mirror region 70 is flush with the Fourier transform plane 56. As described, however, only obliquely illuminating the mirror region 70 with light from the Fourier transform plane 56 will cause defocusing at a peripheral portion of the illumination region and distortion of the illumination shape in the mirror region 70, resulting in a decrease in illumination efficiency.

Figure 10:
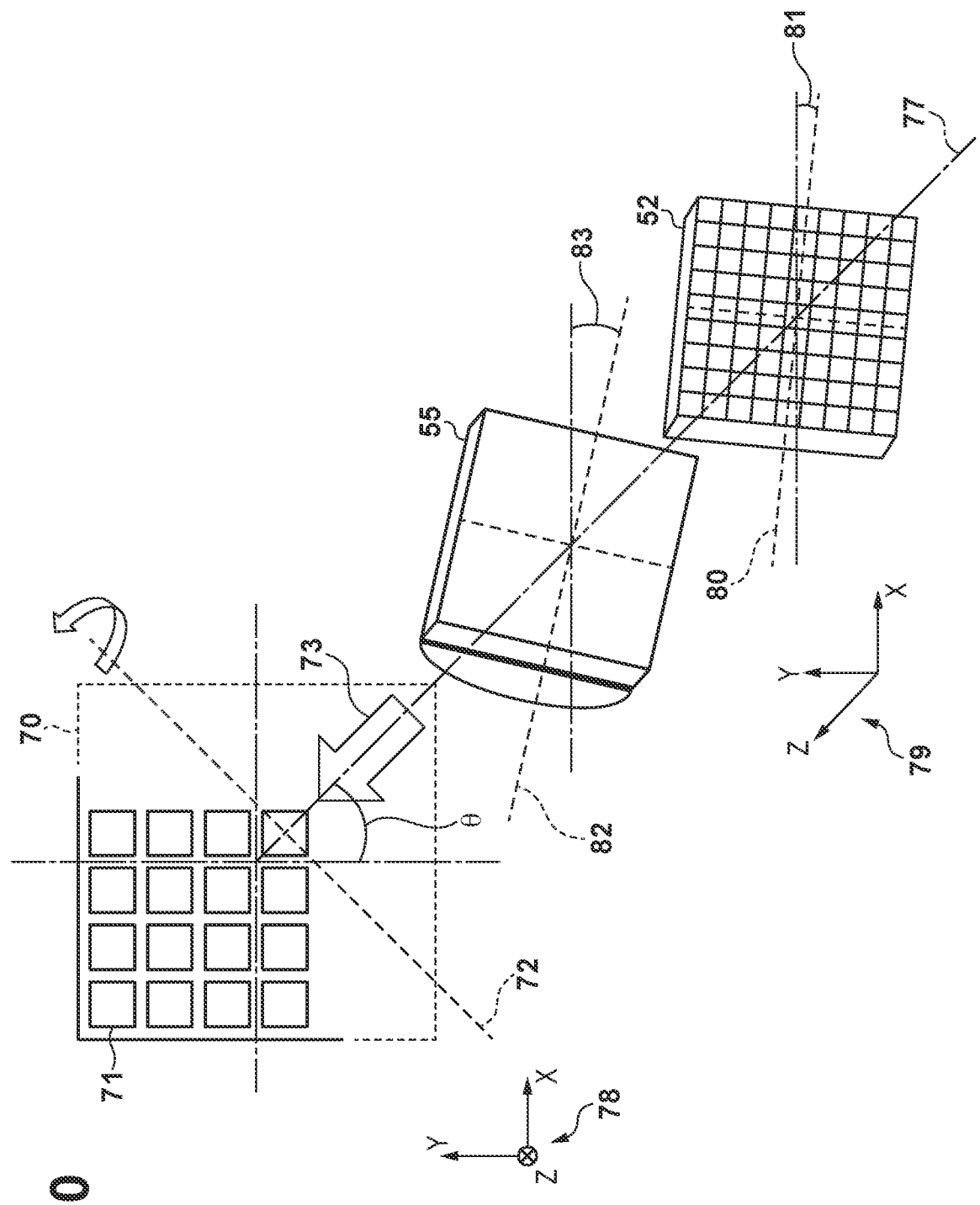
FIG. 10 is a view showing the arrangement relationship between an MLA, a cylindrical lens, and a mirror region according to this embodiment.

For this reason, of the plurality of optical elements included in the optical system of the adjusting unit 21, the MLA 52 and the cylindrical lens 55 are rotated about the optical axis of the optical system in a plane perpendicular to the optical axis. FIG. 10 shows the arrangement relationship between the MIA 52, the cylindrical lens 55, and the mirror region 70. FIG. 10 shows an X-Y plane projection view when FIG. 8 is observed from the positive direction of the Z-axis. Referring to FIG. 10, a coordinate system 78 indicates a coordinate system in the mirror region 70, and a coordinate system 79 indicates a coordinate system on the optical axis 77. The optical axis 77 coincides with the Z-axis of the coordinate system 79. Note that an illustration of optical elements, of the plurality of optical elements included in the optical system, which are rotationally symmetric in a plane perpendicular to the traveling direction of light is omitted in FIG. 10.

The MIA 52 is formed from an assembly or a plurality of micro convex lenses. In the mirror region 70, a plurality of lenses are arranged along the X- and Y-axes of the coordinate system 79. One of the arranging directions of the plurality of lenses arranged in the mirror region 70 is defined as an axis 80. The angle formed between the axis 80 and the X-axis direction in the coordinate system 79 on the optical axis 77 is defined as an angle 81. The MLA 52 is arranged so as to be rotated about the optical axis 77 through the angle 81 in an X-Y plane in the coordinate system 79.

In the cylindrical lens 55, a non-curvature plane direction (a direction in which the lens has no power) of the cylindrical lens 55 is defined as an axis 82. The angle formed between the axis 82 and the X-axis direction in the coordinate system 79 on the optical axis 77 is defined as angle 83. The cylindrical lens 55 is arranged so as to be rotated about the optical axis 77 through the angle 83 in an X-Y plane in the coordinate system 79. FIG. 10 shows the cylindrical lens 55 as one lens. However, two or more lenses like cylindrical lenses 55a and 55b may be arranged, with each lens being independently arranged so as to be rotated. Alternatively, the cylindrical lenses 55a and 55b may be rotated through the same angle and regarded as the single cylindrical lens 55.

Likewise, FIG. 10 shows the MLA 52 as one MLA. However, the MIA 52 may be constituted by two MLAs like the MLAs 52a and 52b. Alternatively, an MLA having curvatures on the two surfaces may be used singly. When the MLA 52 is constituted by a plurality of MLAs, each MLA is preferably rotated through the same angle as one MLA. If the rotation angles of the plurality of MLAs relatively shift, a distribution blurs to result in a decrease in illumination efficiency.

Figure 11A:
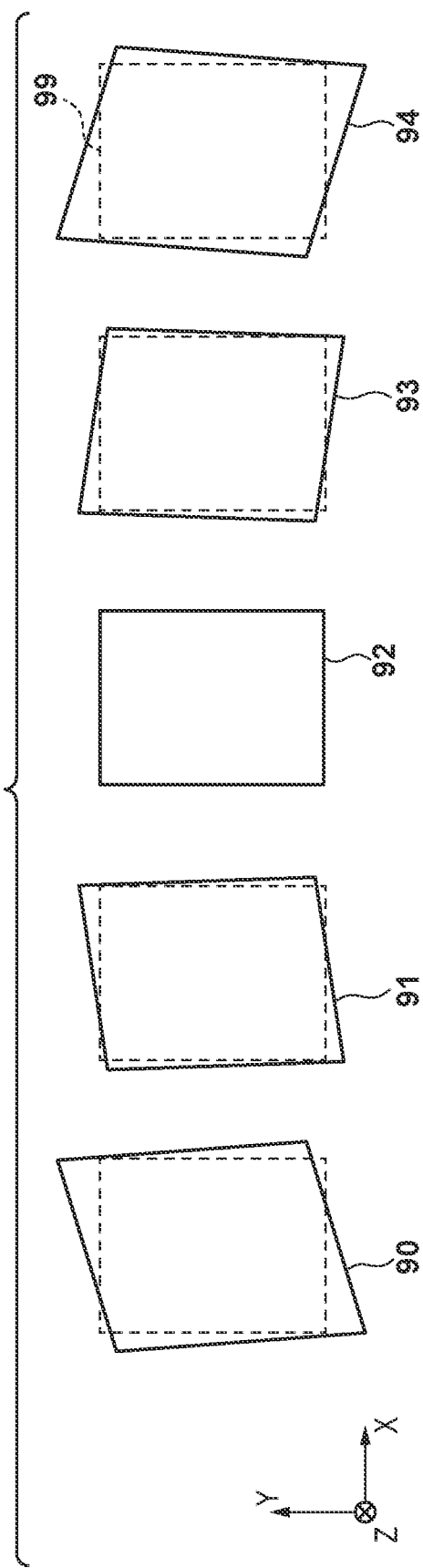
FIGS. 11A and 11B are views showing an example of a change in illumination shape in the mirror region according to this embodiment.
Figure 11B:
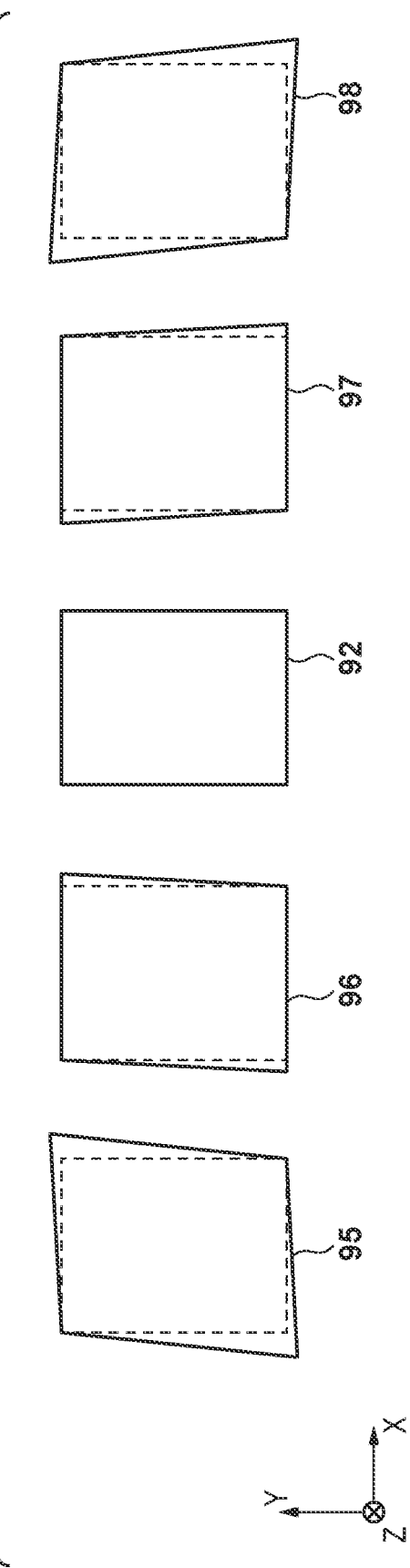

FIGS. 11A and 11B are views each showing an example of a change in illumination shape in the mirror region 70 when the MLA 52 and the cylindrical lens 55 shown in FIG. 10 are rotated. FIG. 11A shows an example of a change in illumination shape in the mirror region 70 when the angle 83 of the cylindrical lens 55 is fixed and the angle 81 of the MLA 52 is changed. Referring to FIG. 11A, an illumination shape 99 indicated by the broken line indicates an illumination shape to be formed in the mirror region 70, which matches a target shape 92. In this embodiment, the target shape 92 has a shape similar to the size (26 mm×33 mm) of a shot region on the substrate 8. The angle 81 of the MLA 52 is changed in the positive/negative direction with reference to the target shape 92. It is obvious that when the angle 81 of the MLA 52 is changed, the illumination shape in the mirror region 70 is formed into a rhombic shape and is rotated in an X-Y plane as indicated by illumination shapes 90, 91, 93, and 94. Under the condition that the angle 81 of the MLA 52 coincides with the target shape 92, the illumination efficiency is high. Note however that as the angle 81 of the MLA 52 is shifted from a condition for matching an illumination shape with the target shape 92, the mirror region 70 cannot be illuminated with the target shape 92, resulting a deterioration in illumination efficiency.

FIG. 11B shows an example of a change in illumination shape in the mirror region 70 when the angle 81 of the MLA 52 is fixed and the angle 83 of the cylindrical lens 55 is changed. Referring to FIG. 11B, the angle 83 of the cylindrical lens 55 is changed in the positive/negative direction with reference to the target shape 92. When the angle 83 of the cylindrical lens 55 is changed, the illumination shape in the mirror region 70 changes to a combination of a rhombic shape and a parallelogram as indicated by illumination shapes 95, 96, 97, and 98. Under a condition that the angle 83 of the cylindrical lens 55 coincides with the target shape 92, the illumination efficiency is high. If the angle 83 of the cylindrical lens 55 is shifted from the condition for matching the illumination shape with the target shape 92, the mirror region 70 cannot be illuminated with the target shape 92.

The optimal value (optimal rotation angle) of the angle 81 of the MLA 52 and that of the angle 83 of the cylindrical lens 55 change due to the following factors. The first factor is an illumination shape to be formed in the mirror region 70. In this embodiment, the illumination shape is similar to the size of a shot region on the substrate 8. The second factor is the incident angles of light with respect to the mirror region 70, that is, the angles θ and φ. In this embodiment, the angle θ is 45°, and the angle φ is 24°. The third factor is the power of the cylindrical lens 55 in the curvature direction (the direction in which the lens has power). The first factor is the size of an illumination region in the mirror region 70, and hence is obtained from an optical design. The second factor is a numerical value determined by the type of optical element arranged on the illumination plane, the type of digital mirror device in this embodiment. The third factor is an optical design value. The optimal rotation angles of the MLA 52 and the cylindrical lens 55 are determined depending on such three parameters.

Figure 12:
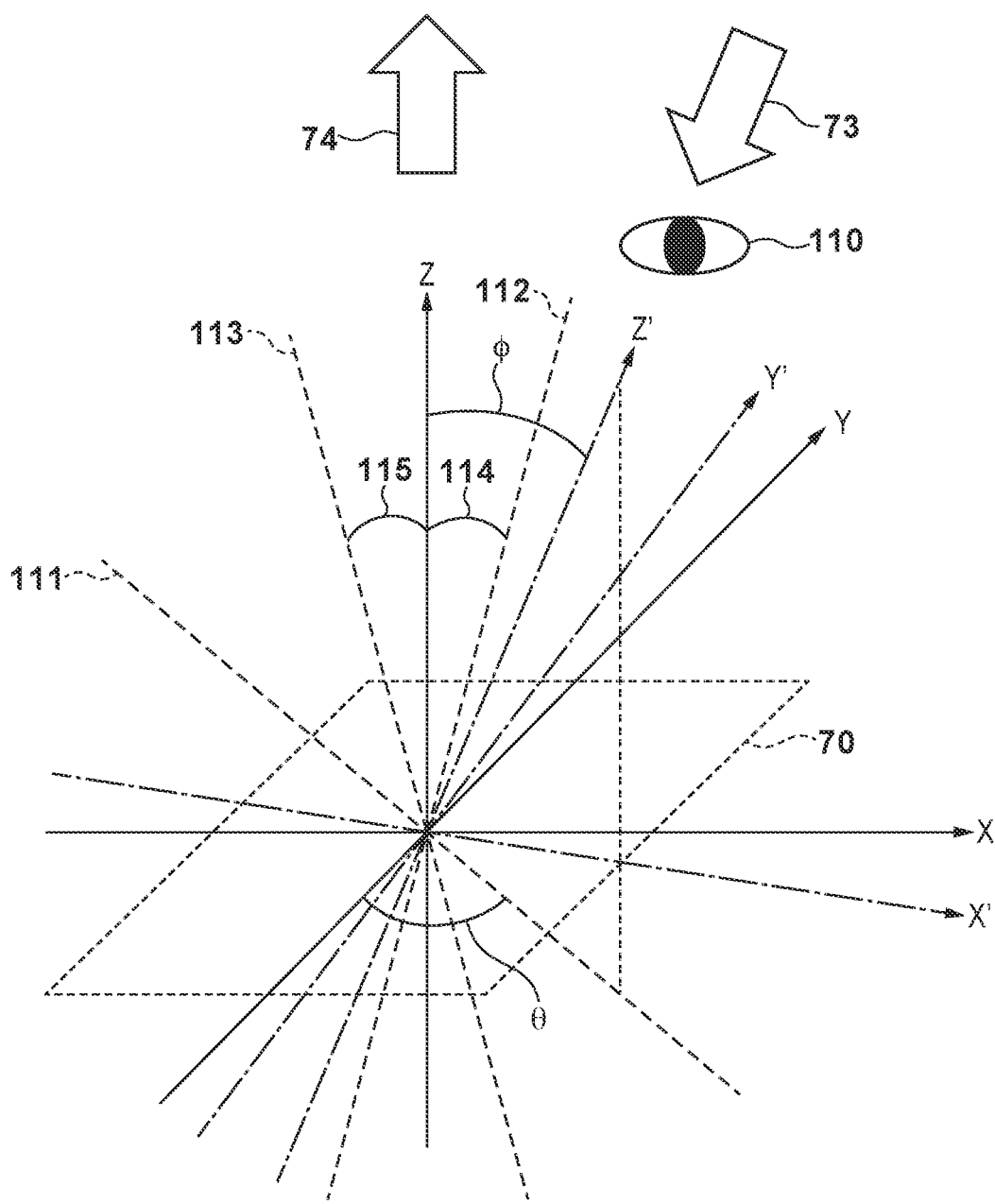
FIG. 12 is a view for explaining the relationship between the two coordinate systems shown in FIG. 10.

A specific example when a target shape is similar to the size (26 mm×33 mm) of a shot region on the substrate 8 will be described. FIG. 12 is a view for explaining the relationship between the two coordinate systems shown in FIG. 10, that is, the coordinate system 78 and the coordinate system 79. The coordinate system 78 corresponds to the XYZ coordinate system shown in FIG. 12, and the coordinate system 79 corresponds to the X'Y'Z' coordinate system shown in FIG. 12. The angle φ of the X'Y'Z' coordinate system tilts at 14° with respect to the XYZ coordinate system, and the angle θ is rotated through 45°. In this case, a plane projection line 111 is a projection line within an X-Y plane on the Z'-axis. The Y-axis and the plane projection line 111 are rotated through 45° within the X-Y plane. In addition, a plane projection line 112 is projection line in the X-Z plane on the Z'-axis. A plane projection line 113 is projection line in the Y-Z plane on the Z'-axis. An angle 114 formed between the Z-axis and the plane projection line 112 in an X-Z plane is 17.5°. In addition, an angle 115 formed between the Z-axis and the plane projection line 112 in a Y-Z plane is 17.5°.

FIGS. 13A to 13C are views showing the arrangements of the MLA 52 and the cylindrical lens 55 and an illumination shape in the mirror region 70 when the X'-Y' plane is visually recognized from a viewpoint 110 along the Z'-axis according to this embodiment. The upper part of each of FIGS. 13A to 13C shows the arrangements of the MLA 52 and the cylindrical lens 55 in the X'Y' coordinate system, and the lower part of each of FIGS. 13A to 13C shows a target shape 120 and one of illumination shapes 121 to 123. Referring to FIG. 13A, a counterclockwise rotation from the positive side of the X'-axis is defined as a positive (+) angle, and a clockwise rotation is defined as a negative (−) angle. The cylindrical lens 55 has power in the transverse direction (curvature plane direction) but has no power in the longitudinal direction (non-curvature plane direction).

FIG. 13A shows a state in which the MLA 52 and the cylindrical lens 55 are not rotated, that is, a reference state in which the arranging direction (axis 80) of the lens elements of the MLA 52 coincides with the power direction (axis 82) of the cylindrical lens 55 in an X'-Y' plane. The angle formed between the axis 80 of the MLA 52 and the X'-axis is 0°. The angle formed between the axis 82 of the cylindrical lens 55 and the X'-axis is 90°. In this state, the illumination shape 121 becomes a parallelogram illumination shape. That is, the target shape 120 has not been able to be implemented.

FIG. 13B shows a state in which only the cylindrical lens 55 is rotated from the reference state shown in FIG. 13A. The angle formed between the axis 82 of the cylindrical lens 55 and the X'-axis is 80°. Since the MLA 52 is not rotated, the angle formed between the axis 80 of the MLA 52 and the X'-axis is 0°. In this state, the illumination shape 122 has the shape of a rotated rectangle. That is, the target shape 120 has not been able to be implemented.

FIG. 13C shows a state in which the MLA 52 and the cylindrical lens 55 are rotated from the state shown in FIG. 13B, that is, a rotated state in which the MLA 52 and the cylindrical lens 55 each are rotated about the Z'-axis as a rotation axis from the reference state shown in FIG. 13A. The angle formed between the axis 80 of the MLA 52 and the X'-axis (the rotation angle about the optical axis) is −2.8°. The angle formed between the axis 82 of the cylindrical lens 55 and the X'-axis (the rotation angle about the optical axis) is 77.2°. In this state, the illumination shape 123 is a rectangular illumination shape, which matches the target shape 120. In other words, the illumination shape formed in the mirror region 70 in the rotated state shown in FIG. 13C is closer to a rectangle than the illumination shape formed in the mirror region 70 in the reference state shown in FIG. 13A.

In this embodiment, the MLA 52 is formed by arranging microlenses at a pitch of 0.3 mm in the x-axis direction and the Y-axis direction. The curvature radius of each microlens is set to 2.2 mm. In addition, in the Fourier transform optical system ranging from the exit plane of the MLA 52 to the mirror region 70, the focal length of the cylindrical lens 55 in the curvature plane direction is set to 103.9 mm, and the focal length in the non-curvature plane direction is set to 133.5 mm.

It is obvious that as the illumination shape to be formed in the mirror region 70, that is, a target shape, and conditions for the optical system change, the configuration conditions for the MLA 52 and the cylindrical lens 55 change. As in this embodiment, the illumination shape to be formed on an illumination plane can be controlled by rotating each of the cylindrical lens 55 and the MLA 52 about the optical axis.

This embodiment has exemplified the MLA 52 and the cylindrical lens 55 in a case in which a shape similar to the size (26 mm×33 mm) of a shot region on the substrate 8 is set as a target shape, and the above optical system is used. In consideration of an assembly error in the optical system, an illumination shape larger than a target shape is preferably set or a target shape preferably includes a margin. Therefore, in this embodiment, the illumination shape to be formed is set to a rectangle, but is not required to have a strictly defined shape. Making an illumination shape similar to a target shape can implement oblique illumination having high illumination efficiency with a simple arrangement.

In this embodiment, in order to compensate for distortion in an illumination region caused by oblique illumination, at least one of the MLA 52 and the cylindrical lens 55 has a rotation angle about the optical axis. In addition, an illumination shape is shaped into a rectangle by compensation for distortion in the illumination region. This makes it possible to shape the illumination shape formed in the mirror region 70 into the target shape.

As described above, the optical system of the substrate heating unit 12 according to this embodiment can implement oblique illumination with high illumination efficiency without forming the shine-proof optical system 61 while avoiding increases in the cost and size of the apparatus.

Second Embodiment

FIG. 14 is a schematic view showing the arrangement of a projector apparatus (projection apparatus) 200 as an aspect of the present invention. The projector apparatus 200 includes a light source 201, a color wheel 202, an MLA 203, a cylindrical lens 204, a reflecting plate 205, a digital mirror device 206, and a projection lens (projection unit) 207.

The light source 201 is a high-intensity light source such as a high-pressure mercury lamp. Light from the light source 201 is collected by a condenser lens (not shown) and caused to enter the color wheel 202. The color wheel 202 is divided into R, G, and B regions and is configured to be rotatable. Light passing through the color wheel 202 is optically integrated via the MLA 203, the cylindrical lens 204, and an integrator optical system (not shown). The MLA 203 and the integrator optical system reduce the illuminance unevenness of light from the light source 201.

Light passing through the integrator optical system obliquely illuminates the digital mirror device 206 via the reflecting plate 205 which defines an optical path. The digital mirror device 206 is formed by arranging a plurality of mirrors, each having a drive axis, in the form of an array. In this embodiment, each of the plurality of mirrors can be driven to a state in which it tilts at ±12°. In the ON state, light entering the digital mirror device 206 at an angle of 24° is reflected by the mirror toward the projection lens 207. In the OFF state, light is reflected toward a light absorber 209 arranged at a position away from the projection lens 207. Light (which generates an image) from the digital mirror device 206 is projected onto a screen (display surface) 208 via the projection lens 207.

In this case, a coordinate system 221 indicates a coordinate system in the digital mirror device 206. Each of the micro mirrors constituting the digital mirror device 206 can be tilted at ±12°, as described above. An incident angle φ with respect to the digital mirror device 206 with reference to the Z-axis of the coordinate system 221 is 24°. In addition, the digital mirror device 206 is illuminated from a direction at an angle θ in the X-Y plane as the surface on which the plurality of mirrors are arranged. In this embodiment, the angle θ is 45°.

In this embodiment, the MLA 203 and the cylindrical lens 204 are configured to be rotatable about the Z-axis in a coordinate system 220. The coordinate system 220 indicates a coordinate system ranging from the light source 201 to the reflecting plate 205. In the MLA 203 and the cylindrical lens 204, an axis 222 indicates the X-axis, and an axis 223 indicates the Y-axis. In the embodiment, one of the arranging directions of a plurality of microlens elements constituting the MLA 203 is defined as an axis 210, the 203 rotates through an angle 212 formed between the axis 210 and the Y-axis 223 within an X-Y plane. In addition, when a direction (generatrix) in which the cylindrical lens 204 has no power is defined as an axis 211, the cylindrical lens 204 rotates through an angle 213 formed between the axis 211 and the Y-axis 223 within the X-Y plane. It is possible to change an illumination shape on the digital mirror device 206 arranged on an illumination plane by changing the angle 212 of the MIA 203 and the angle 218 of the cylindrical lens 204. The angles 212 and 213 are determined to form a predetermined illumination shape on the mirror device 206 or the screen 208. An image (video) can be displayed on the screen 208 by projecting R, G, and B colors time-divisionally within one frame while synchronizing the rotation of the color wheel 202 with ON/OFF control of the digital mirror device 206.

In the projector apparatus 200, the Fourier transform optical system can illuminate the digital mirror device 206 with light from the exit plane of the MLA 203, and hence the of the optical system illuminating the digital mirror device 206 can be reduced. In addition, since the number of lenses of the optical system can be reduced, it is possible to avoid increases in the cost and size of the apparatus and implement oblique illumination with high illumination efficiency. This embodiment has exemplified the single-panel projector apparatus. However, the embodiment can be applied to a three-panel projector apparatus or a projector apparatus using an LED as a light source.

Third Embodiment

A method of manufacturing a device (a semiconductor device, magnetic storage medium, liquid crystal display element, or the like) as an article will be described. This manufacturing method includes a step of forming a pattern on a substrate (a wafer, glass plate, film-like substrate, or the like) by using an imprint apparatus 1. The manufacturing method also includes a step of processing the substrate on which the pattern is formed. This processing step can include a step of removing the residual film of the pattern. In addition, the method can include other known steps such as a step of etching the substrate using the pattern as a mask. The method of manufacturing an article according to this embodiment is advantageous over the related art in terms of at least the performance, quality, productivity, or production cost of articles.

In addition, the first and second embodiments have exemplified the imprint apparatus and the projector apparatus using the digital mirror devices. It is, however, obvious that the present invention can also be applied to an apparatus using no digital mirror device. The present invention can be applied to a case in which a rectangular illumination shape is formed on an illumination plane, and the illumination plane is obliquely illuminated with light optically integrated via an MLA from a direction other than a direction perpendicular to one side of the illumination plane. It is possible to form a rectangular illumination shape on an illumination plane by arranging an MLA and a cylindrical lens in an optical system and rotating the MLA and the cylindrical lens within a plane perpendicular to the traveling direction of light.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2016-073177 filed on Mar. 31, 2016, which is hereby incorporated by reference herein in its entirety.

What is claimed is:

1. An illumination apparatus which performs oblique illumination, the apparatus comprising:
   a first optical element formed with an array of a plurality of optical components each configured to generate a point light source; and
   a second optical element configured to receive light from the first optical element and form an illumination region, with a power thereof in one direction being different from a power thereof in a direction perpendicular to the one direction,
   wherein each of the first optical element and the second optical element has a rotation angle about an optical axis thereof so as to perform compensation for distortion of the illumination region by the oblique illumination, and
   wherein the rotation angle of the first optical element is different from the rotation angle of the second optical element.

2. The apparatus according to claim 1, wherein the illumination region is caused to have a rectangular shape by the compensation.

3. The apparatus according to claim 1, wherein a shape of the illumination region is closer to a rectangle than that in a case where the rotation angle of the first optical element is equal to the rotation angle of the second optical element.

4. The apparatus according to claim 2, wherein the optical axis has an azimuth of 45° relative to one side of the rectangle and an elevation angle of 24° relative to a normal to a plane to be illuminated.

5. The apparatus according to claim 1, wherein a plane to be illuminated is a Fourier transform plane with respect to an exit plane of the first optical element.

6. The apparatus according to claim 1, wherein the first optical element has 2.8° as the rotation angle, and the second optical element has 77.2° as the rotation angle.

7. The apparatus according to claim 1, wherein the array comprises a microlens array.

8. The apparatus according to claim 1, wherein the second optical element comprises at least one of a cylindrical lens, an anamorphic lens, and a toric lens.

9. An optical apparatus comprising:
   a mirror array formed with an array of a plurality of mirrors each having a drive axis, an arranging direction of the plurality of mirrors being different from a direction of the drive axis; and
   an illumination apparatus defined in claim 1 and configured to illuminate the mirror array.

10. An imprint apparatus which molds an imprint material on a substrate to form a pattern on the substrate, the apparatus comprising:

a heating device configured to heat the substrate by illuminating the substrate to deform the substrate, wherein the heating device includes an illumination apparatus defined in claim 1 and is configured to heat the substrate by illuminating the substrate via the illumination apparatus.

11. An imprint apparatus which molds an imprint material on a substrate to form a pattern on the substrate, the apparatus comprising:

a heating device configured to heat the substrate by illuminating the substrate to deform the substrate, wherein the heating device includes an optical apparatus and is configured to heat the substrate by illuminating the substrate via the optical apparatus, and wherein the optical apparatus includes a mirror array formed with an array of a plurality of mirrors each having a drive axis, an arranging direction of the plurality of mirrors being different from a direction of the drive axis, and an illumination apparatus defined in claim 1 and configured to illuminate the mirror array.

12. A projection apparatus comprising:

a projection device configured to project an image, wherein the projection device includes an illumination apparatus defined in claim 1 and is configured to project the image via the illumination apparatus.

13. A method of manufacturing an article, the method comprising steps of:

forming a pattern on a substrate using an imprint apparatus; and processing the substrate, on which the pattern has been formed, to manufacture the article, wherein the imprint apparatus molds an imprint material on the substrate to form a pattern on the substrate, and includes:

a heating device configured to heat the substrate by illuminating the substrate to deform the substrate, wherein the heating device includes an illumination apparatus and is configured to heat the substrate by illuminating the substrate via the illumination apparatus, wherein the illumination apparatus performs oblique illumination and includes:

a first optical element formed with an array of a plurality of optical components each configured to generate a point light source; and a second optical element configured to receive light from the first optical element and form an illumination region, with a power thereof in one direction being different from a power thereof in a direction perpendicular to the one direction, wherein each of the first optical element and the second optical element has a rotation angle about an optical axis thereof so as to perform compensation for distortion of the illumination region by the oblique illumination, and wherein the rotation angle of the first optical element is different from the rotation angle of the second optical element.

* * * * *